(12) United States Patent
Tay et al.

(10) Patent No.: US 8,043,894 B2
(45) Date of Patent: Oct. 25, 2011

(54) INTEGRATED CIRCUIT PACKAGE SYSTEM WITH REDISTRIBUTION LAYER

(75) Inventors: Lionel Chien Hui Tay, Singapore (SG); Zigmund Ramirez Camacho, Singapore (SG); Henry Descalzo Bathan, Singapore (SG)

(73) Assignee: Stats Chippac Ltd., Singapore (SG)

(*) Notice: Subject to any disclaimer, the term of this patent is extended or adjusted under 35 U.S.C. 154(b) by 0 days.

(21) Appl. No.: 12/198,491

(22) Filed: Aug. 26, 2008

(65) Prior Publication Data

US 2010/0052131 A1   Mar. 4, 2010

(51) Int. Cl.
*H01L 21/00* (2006.01)

(52) U.S. Cl. ........ 438/109; 438/108; 438/123; 438/124; 438/127; 257/676; 257/777; 257/778; 257/686; 257/790

(58) Field of Classification Search ........... 257/686, 257/777, 778, 787, 666, 690, 692, 696, 670, 257/671, 672, 673, 674, 675, 790, E23.001, 257/676, 789, 734, 788, 678; 438/108, 109, 438/123, 127, 106, 124
See application file for complete search history.

(56) References Cited

U.S. PATENT DOCUMENTS

| | | | |
|---|---|---|---|
| 5,519,936 A | 5/1996 | Andros et al. | |
| 5,668,405 A | 9/1997 | Yamashita | |
| 6,150,193 A | 11/2000 | Glenn | |
| 6,239,496 B1 | 5/2001 | Asada | |
| 6,281,437 B1 | 8/2001 | Anderson et al. | |
| 6,342,406 B1 | 1/2002 | Glenn et al. | |
| 6,407,381 B1 | 6/2002 | Glenn et al. | |
| 6,448,506 B1 | 9/2002 | Glenn et al. | |
| 6,451,626 B1 | 9/2002 | Lin | |
| 6,486,545 B1* | 11/2002 | Glenn et al. | 257/686 |
| 6,492,699 B1 | 12/2002 | Glenn et al. | |
| 6,566,745 B1 | 5/2003 | Beyne et al. | |
| 6,571,466 B1 | 6/2003 | Glenn et al. | |
| 6,621,172 B2* | 9/2003 | Nakayama et al. | 257/787 |
| 6,762,117 B2 | 7/2004 | Lam et al. | |
| 6,774,499 B1 | 8/2004 | Yang | |
| 6,787,901 B2 | 9/2004 | Reyes et al. | |
| 6,794,760 B1 | 9/2004 | Jaeck et al. | |
| 6,822,316 B1 | 11/2004 | Hsuan | |
| 6,838,310 B1 | 1/2005 | Hsuan | |
| 6,885,107 B2 | 4/2005 | Kinsman | |
| 6,891,273 B2 | 5/2005 | Pu et al. | |
| 6,982,491 B1 | 1/2006 | Fan et al. | |
| 7,208,345 B2 | 4/2007 | Meyer et al. | |
| 7,262,497 B2 | 8/2007 | Fang | |
| 7,547,977 B2* | 6/2009 | Song et al. | 257/786 |
| 2004/0212088 A1* | 10/2004 | Chen et al. | 257/738 |
| 2005/0006745 A1 | 1/2005 | Nishimura | |
| 2005/0046000 A1* | 3/2005 | Seng et al. | 257/676 |
| 2005/0051859 A1 | 3/2005 | Hoffman | |
| 2006/0186514 A1* | 8/2006 | Shim et al. | 257/666 |
| 2007/0063331 A1 | 3/2007 | Kwon et al. | |
| 2008/0093717 A1* | 4/2008 | Huang et al. | 257/673 |
| 2008/0304790 A1* | 12/2008 | Minamio et al. | 385/33 |
| 2009/0243082 A1 | 10/2009 | Camacho et al. | |

* cited by examiner

*Primary Examiner* — Ha Tran T Nguyen
*Assistant Examiner* — Thanh Y Tran
(74) *Attorney, Agent, or Firm* — Mikio Ishimaru

(57) ABSTRACT

An integrated circuit package system includes forming a first external interconnect having both a first side and a second side that is an opposing side to the first side; forming a first encapsulation around a first integrated circuit and the first external interconnect with the first side, the second side, and the first active side of the first integrated circuit exposed; forming a planar interconnect between the first active side and the second side; forming a second encapsulation covering the planar interconnect and the first active side; connecting a second integrated circuit over the first integrated circuit and the first side; and forming a top encapsulation over the second integrated circuit.

20 Claims, 5 Drawing Sheets

INTEGRATED CIRCUIT PACKAGE SYSTEM WITH REDISTRIBUTION LAYER

CROSS-REFERENCE TO RELATED APPLICATION

The present application contains subject matter related to co-pending U.S. patent application Ser. No. 12/055,526 filed Mar. 26, 2008. The related application is assigned to STATS ChipPAC Ltd.

TECHNICAL FIELD

The present invention relates generally to an integrated circuit package system and more particularly to an integrated circuit package system having an encapsulation.

BACKGROUND ART

Modern consumer electronics, such as smart phones, personal digital assistants, and location based services devices, as well as enterprise electronics, such as servers and storage arrays, are packing more integrated circuits into an ever-shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself. Numerous technologies have been developed to meet these requirements. Some of the research and development strategies focus on new package technologies while others focus on improving the existing and mature package technologies.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact locking terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat nonleaded ("QFN") package. QFN packages typically include a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with thinner and thinner profile in high volume. Despite the trend towards miniaturization and thinner profile, more functions and more integrated circuits continue to be packed into QFN packages. Typical QFN solutions face problems providing the high density and high count I/O needed for modern electronic products.

Thus, a need still remains for an integrated circuit package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a first external interconnect having both a first side and a second side that is an opposing side to the first side; forming a first encapsulation around a first integrated circuit and the first external interconnect with the first side, the second side, and the first active side of the first integrated circuit exposed; forming a planar interconnect between the first active side and the second side; forming a second encapsulation covering the planar interconnect and the first active side; connecting a second integrated circuit over the first integrated circuit and the first side; and forming a top encapsulation over the second integrated circuit.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
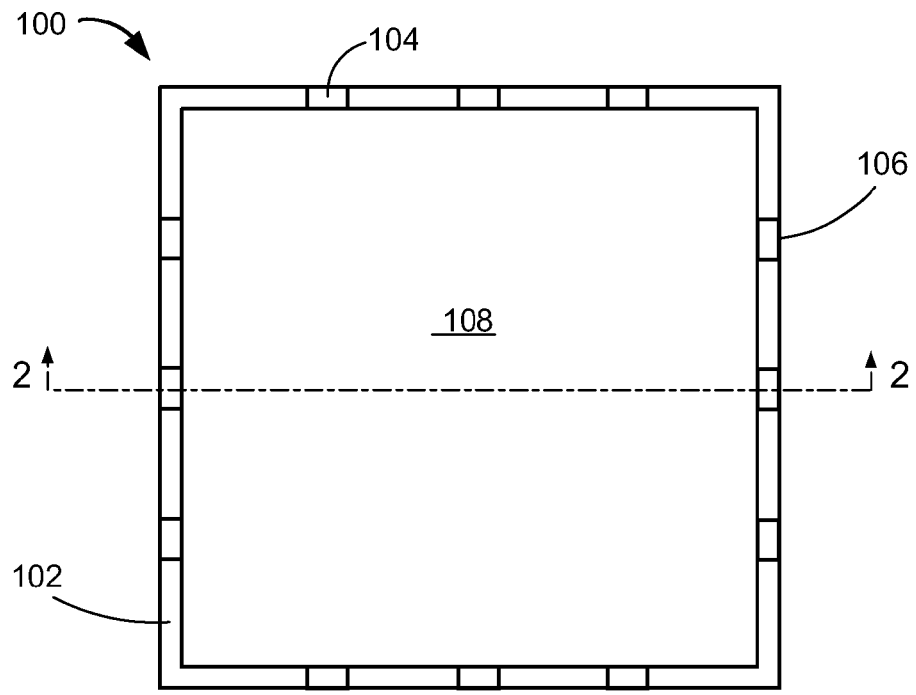
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a first encapsulation 102, such as a cover including an epoxy molding compound, and first external interconnects 104, such as leads. The first encapsulation 102 can expose the first external interconnects 104. The first encapsulation 102 is planar with a periphery side 106 of the first external interconnects 104.

A top encapsulation 108, such as a cover including an epoxy molding compound, can be over the first encapsulation 102 and the first external interconnects 104. The top encapsulation 108, in this example, is shown not extending to the periphery side 106 of the first external interconnects 104.

For illustrative purposes, the integrated circuit package system 100 is shown with the top encapsulation 108 not extending to the periphery side 106 of the first external interconnects 104, although it is understood that the integrated circuit package system 100 can have the top encapsulation 108 in a different configuration. For example, the top encapsulation 108 can extend to the periphery side 106 of the first external interconnects 104.

Also for illustrative purposes, the integrated circuit package system 100 is shown with one row of the first external interconnects 104, although it is understood that the integrated circuit package system 100 can include a different number of rows. For example, the integrated circuit package system 100 can have more than one row of the first external interconnects 104 or different number of rows of the first external interconnects 104 along each side of the integrated circuit package system 100.

Further for illustrative purposes, the integrated circuit package system 100 is described with the first encapsulation 102 and the top encapsulation 108 formed from the same material, although it is understood that the integrated circuit package system 100 can have the first encapsulation 102 and the top encapsulation 108 formed from different materials. For example, the top encapsulation 108 can be formed from an optically transparent material.

Figure 2:
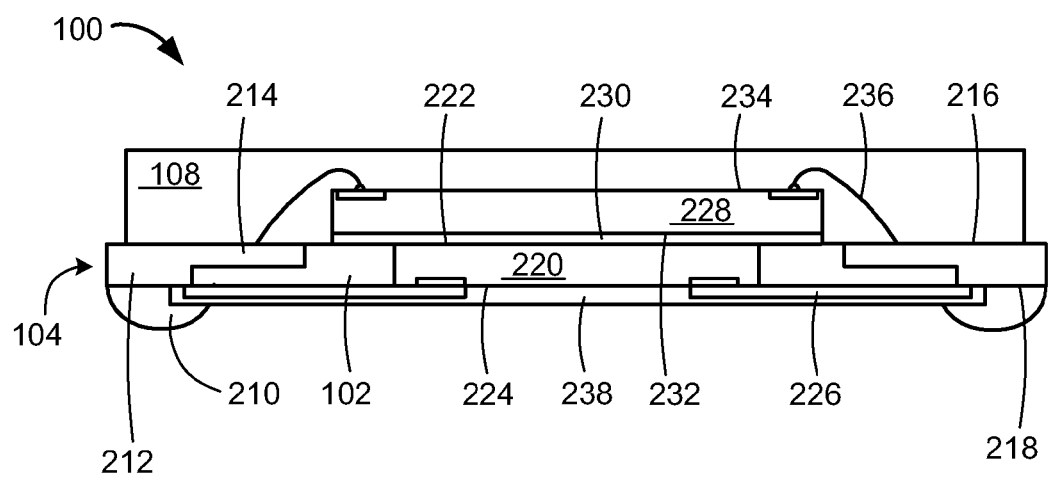
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts each of the first external interconnects 104 having both a base 212 and a tip 214. The base 212 can be towards the periphery of the integrated circuit package system 100. The tip 214 can be towards the interior, away from the periphery, of the integrated circuit package system 100.

A first side 216 of each of the first external interconnects 104 can have the base 212 planar with the tip 214. A second side 218 of each of the first external interconnects 104 can have the base 212 non-planar with the tip 214. As an example, the thickness of the base 212 is greater than the thickness of the tip 214. The first side 216 and the second side 218 are horizontal opposing sides of the first external interconnects 104.

A first integrated circuit 220, such as an integrated circuit die, is preferably in a non-peripheral location of the integrated circuit package system 100. The first external interconnects 104 are adjacent to the first integrated circuit 220 along the periphery of the integrated circuit package system 100. The first integrated circuit 220 includes a first non-active side 222 and a first active side 224, wherein the first active side 224 includes active circuitry fabricated thereon.

The first encapsulation 102 surrounds and exposes the first integrated circuit 220 and the first external interconnects 104. The second side 218 of the tip 214 can be within the first encapsulation 102. The first encapsulation 102 can expose the first side 216 of the first external interconnects 104. The first encapsulation 102 can expose the second side 218 of the base 212. The first encapsulation 102 can be planar with the first active side 224 and the second side 218 of the base 212. The first encapsulation 102 can expose the first active side 224.

Planar interconnects 226, such as a conductive layer or multiple layers including a conductive layer, can connect the first integrated circuit 220 and the second side 218 of the base 212 of the first external interconnects 104. Each of the planar interconnects 226 includes an entire horizontal side along a single plane. The first active side 224 can be planar with the second side 218 of the base 212. The first non-active side 222 can be planar with the first side 216 of the first external interconnects 104.

For illustrative purposes, the integrated circuit package system 100 is shown with the first non-active side 222 planar with the first side 216 of the first external interconnects 104, although it is understood that the integrated circuit package system 100 can have a different configuration of the first integrated circuit 220 with the first external interconnects 104. For example, the first non-active side 222 may not be planar with the first side 216 and may not extend above the first side 216 of the first external interconnects 104.

A second integrated circuit 228, such as an integrated circuit die, can be over the first integrated circuit 220 with an adhesive 230 such as a die-attach adhesive. The second integrated circuit 228 includes a second non-active side 232 and a second active side 234. The second active side 234 includes active circuitry fabricated thereon. The second non-active side 232 faces the first integrated circuit 220. Internal interconnects 236, such as bond wires or ribbon bond wires, can connect the second active side 234 and the first side 216 of the tip 214.

The top encapsulation 108 can be over the first encapsulation 102 covering the second integrated circuit 228 and the internal interconnects 236. The top encapsulation 108 can expose a periphery portion of the first external interconnects 104. The top encapsulation 108 can form a hermetic seal with the first encapsulation 102.

A second encapsulation 238 such as a cover including a passivation layer, can cover the first active side 224 of the first integrated circuit 220, the planar interconnects 226, and an interior portion of the second side 218 of the base 212 exposing a peripheral portion of the second side 218 of the base 212. The second encapsulation 238 can form a hermetic seal with the first encapsulation 102.

Second external interconnects 210, such as solder balls, can attach to the second side 218 of the base 212 of the first external interconnects 104. The second external interconnects 210 can connect to the next system level (not shown), such as a printed circuit board or another integrated circuit package system.

For illustrative purposes, the integrated circuit package system 100 is shown having the second integrated circuit 228 overhanging the first integrated circuit 220, although it is understood that the integrated circuit package system 100 can have different configurations of the first integrated circuit 220 and the second integrated circuit 228. For example, the first integrated circuit 220 and the second integrated circuit 228 can have the same horizontal dimensions. As another example, the first integrated circuit 220 can horizontally extend beyond the second integrated circuit 228. Further for example, the first integrated circuit 220, the second integrated circuit 228, or a combination thereof can be packaged integrated circuits.

It has been discovered that the present invention provides an integrated circuit package system with low cost and low profile with the planar interconnects with quad flat non-lead (QFN) packages. The planar interconnects at the bottom of the integrated circuit package system eliminates wire-bonding process reducing cost, improving reliability, and lowering package profile. The planar interconnect improves the reliability and yield of the integrated circuit package system by eliminating wire loops and sweeps accompanying bond wires. The application of planar interconnects with QFN package further reduces cost.

Figure 3:
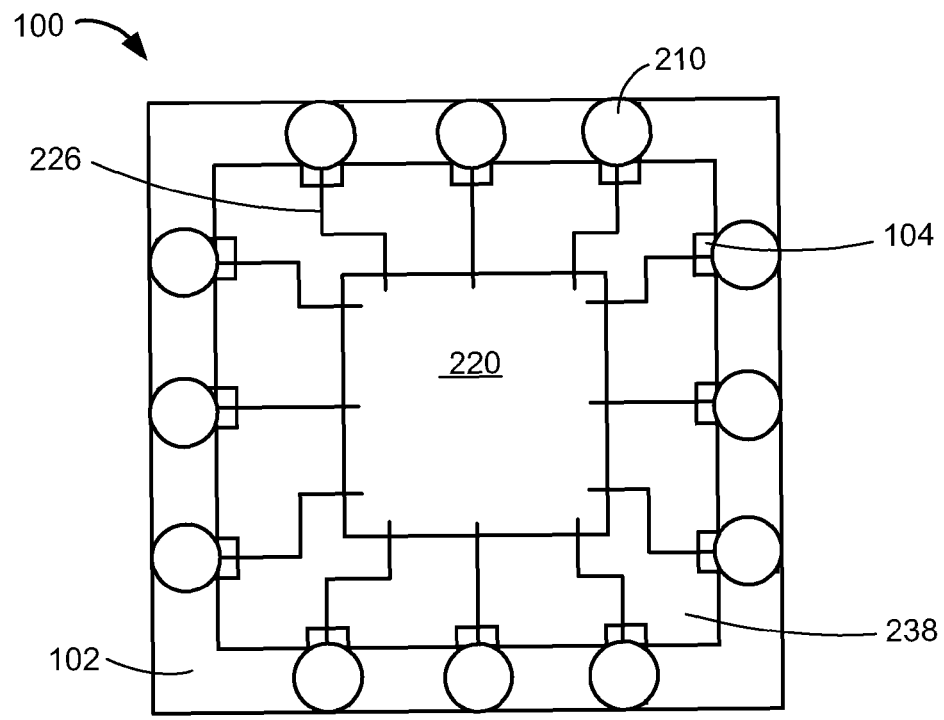
FIG. 3 is a bottom view of the integrated circuit package system of FIG. 1.

Referring now to FIG. 3, therein is shown a bottom view of the integrated circuit package system 100 of FIG. 1. The bottom view depicts the first encapsulation 102 surrounding and exposing the first external interconnects 104. The second external interconnects 210 can attach to the exposed portion of the first external interconnects 104.

The first encapsulation 102 can expose the first integrated circuit 220. The planar interconnects 226 can connect the first integrated circuit 220 and the first external interconnects 104. The second encapsulation 238 can cover the first integrated circuit 220, and a portion of the planar interconnects 226, and a portion of the first external interconnects 104. In this example, the second encapsulation 238 is transparent.

Figure 4:
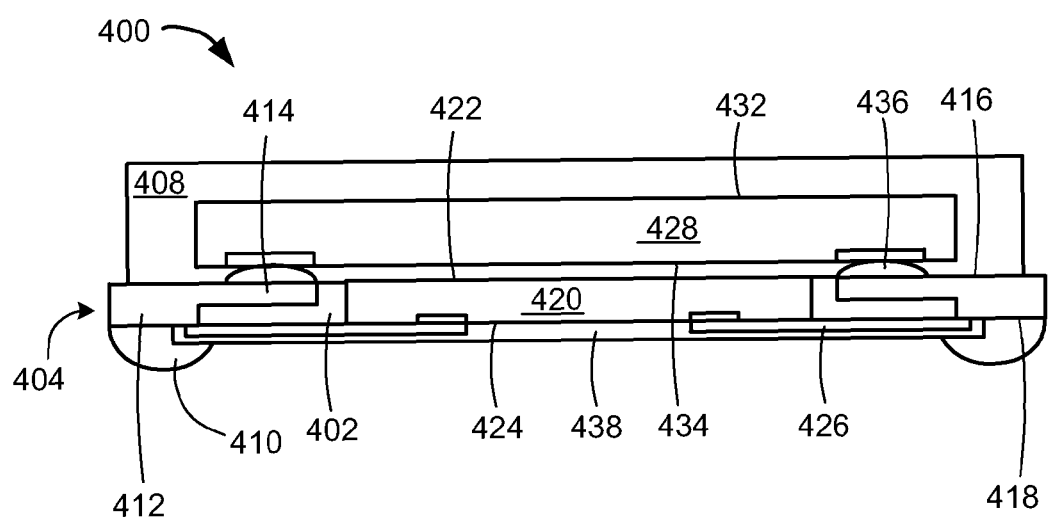
FIG. 4 is a cross-sectional view of an integrated circuit package system exemplified by the top view of FIG. 1 along ling 2-2 of FIG. 1 in a second embodiment of the present invention.

Referring now to FIG. 4, therein is shown a cross-sectional view of an integrated circuit package system 400 exemplified by the top view of FIG. 1 along ling 2-2 of FIG. 1 in a second embodiment of the present invention. The integrated circuit package system 400 includes structural similarities to the integrated circuit package system 100 of FIG. 2.

The cross-sectional view depicts each of first external interconnects 404, such as leads, having both a base 412 and a tip 414. The base 412 can be towards the periphery of the integrated circuit package system 400. The tip 414 can be towards the interior, away from the periphery, of the integrated circuit package system 400.

A first side 416 of each of the first external interconnects 404 can have the base 412 planar with the tip 414. A second side 418 of each of the first external interconnects 404 can have the base 412 non-planar with the tip 414. The thickness of the base 412 is greater than the thickness of the tip 414. The first side 416 and the second side 418 are horizontal opposing sides of the first external interconnects 404.

A first integrated circuit 420, such as an integrated circuit die, is preferably in a non-peripheral location of the integrated circuit package system 400. The first external interconnects 404 are adjacent to the first integrated circuit 420 along the periphery of the integrated circuit package system 400. The first integrated circuit 420 includes a first non-active side 422 and a first active side 424, wherein the first active side 424 includes active circuitry fabricated thereon.

A first encapsulation 402 surrounds and exposes the first integrated circuit 420 and the first external interconnects 404. The second side 418 of the tip 414 can be within the first encapsulation 402. The first encapsulation 402 can expose the first side 416 of the first external interconnects 404. The first encapsulation 402 can expose the second side 418 of the base 412. The first encapsulation 402 can be planar with the first active side 424 and the second side 418 of the base 412. The first encapsulation 402 can expose the first active side 424.

Planar interconnects 426, such as a conductive layer or multiple layers including a conductive layer, can connect the first integrated circuit 420 and the second side 418 of the base 412 of the first external interconnects 404. Each of the planar interconnects 426 includes an entire horizontal side along a single plane. The first active side 424 can be planar with the second side 418 of the base 412. The first non-active side 422 can be planar with the first side 416 of the first external interconnects 404.

For illustrative purposes, the integrated circuit package system 400 is shown with the first non-active side 422 planar with the first side 416 of the first external interconnects 404, although it is understood that the integrated circuit package system 400 can have a different configuration of the first integrated circuit 420 with the first external interconnects 404. For example, the first non-active side 422 may not be planar with the first side 416 and may not extend above the first side 416 of the first external interconnects 404.

A second integrated circuit 428, such as a flip chip, can be over and overhang the first integrated circuit 420. The second integrated circuit 428 includes a second non-active side 432 and a second active side 434. The second active side 434 includes active circuitry fabricated thereon. The second active side 434 faces the first integrated circuit 420. Internal interconnects 436, such as solder bumps, can connect the second active side 434 and the first side 416 of the tip 414.

A top encapsulation 408 can be over the first encapsulation 402 covering the second integrated circuit 428 and the internal interconnects 436. The top encapsulation 408 can expose a periphery portion of the first external interconnects 404. The top encapsulation 408 can also be between the second active side 434 and the first integrated circuit 420. The top encapsulation 408 can form a hermetic seal with the first encapsulation 402.

A second encapsulation 438 such as a cover including a passivation layer, can cover the first active side 424 of the first integrated circuit 420, the planar interconnects 426, and an interior portion of the second side 418 of the base 412 exposing a peripheral portion of the second side 418 of the base 412. The second encapsulation 438 can form a hermetic seal with the first encapsulation 402.

Second external interconnects 410, such as solder balls, can attach to the second side 418 of the base 412 of the first external interconnects 404. The second external interconnects 410 can connect to the next system level (not shown), such as a printed circuit board or another integrated circuit package system.

Figure 5:
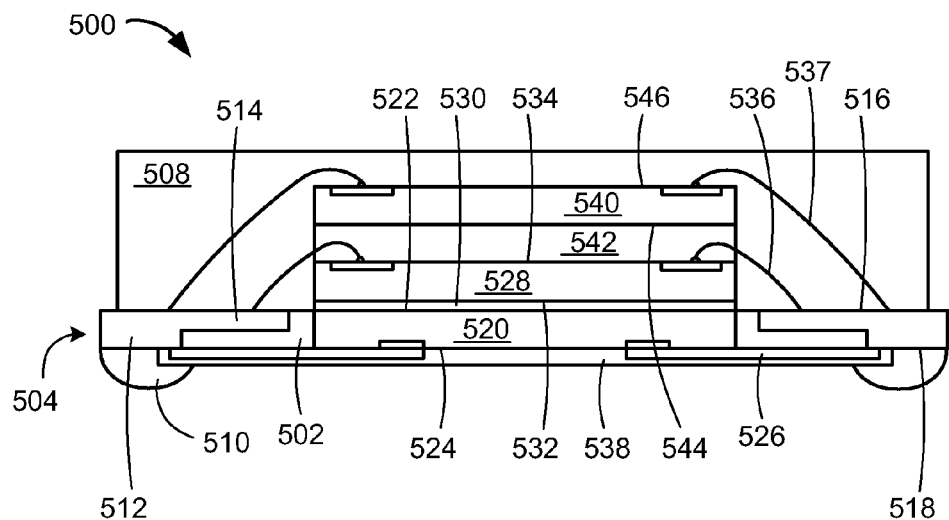
FIG. 5 is a cross-sectional view of an integrated circuit package system exemplified by the top view of FIG. 1 along ling 2-2 of FIG. 1 in a third embodiment of the present invention.

Referring now to FIG. 5, therein is shown a cross-sectional view of an integrated circuit package system 500 exemplified by the top view of FIG. 1 along ling 2-2 of FIG. 1 in a third embodiment of the present invention. The integrated circuit package system 500 includes structural similarities to the integrated circuit package system 100 of FIG. 2.

The cross-sectional view depicts each of first external interconnects 504, such as leads, having both a base 512 and a tip 514. The base 512 can be towards the periphery of the integrated circuit package system 500. The tip 514 can be towards the interior, away from the periphery, of the integrated circuit package system 500.

A first side 516 of each of the first external interconnects 504 can have the base 512 planar with the tip 514. A second side 518 of each of the first external interconnects 504 can have the base 512 non-planar with the tip 514. The thickness of the base 512 is greater than the thickness of the tip 514. The first side 516 and the second side 518 are horizontal opposing sides of the first external interconnects 504.

A first integrated circuit 520, such as an integrated circuit die, is preferably in a non-peripheral location of the integrated circuit package system 500. The first external interconnects 504 are adjacent to the first integrated circuit 520 along the periphery of the integrated circuit package system 500. The first integrated circuit 520 includes a first non-active side 522 and a first active side 524, wherein the first active side 524 includes active circuitry fabricated thereon.

A first encapsulation 502 surrounds and exposes the first integrated circuit 520 and the first external interconnects 504. The second side 518 of the tip 514 can be within the first encapsulation 502. The first encapsulation 502 can expose the first side 516 of the first external interconnects 504. The first encapsulation 502 can expose the second side 518 of the base 512. The first encapsulation 502 can be planar with the first active side 524 and the second side 518 of the base 512. The first encapsulation 502 can expose the first active side 524.

Planar interconnects 526, such as a conductive layer or multiple layers including a conductive layer, can connect the first integrated circuit 520 and the second side 518 of the base 512 of the first external interconnects 504. Each of the planar interconnects 526 includes an entire horizontal side along a single plane. The first active side 524 can be planar with the second side 518 of the base 512. The first non-active side 522 can be planar with the first side 516 of the first external interconnects 504.

For illustrative purposes, the integrated circuit package system 500 is shown with the first non-active side 522 planar with the first side 516 of the first external interconnects 504, although it is understood that the integrated circuit package system 500 can have a different configuration of the first integrated circuit 520 with the first external interconnects 504. For example, the first non-active side 522 may not be planar with the first side 516 and may not extend above the first side 516 of the first external interconnects 504.

A second integrated circuit 528, such as an integrated circuit die, can be over the first integrated circuit 520 with an adhesive 530 such as a die-attach adhesive. The second integrated circuit 528 includes a second non-active side 532 and a second active side 534. The second active side 534 includes active circuitry fabricated thereon. The second non-active side 532 faces the first integrated circuit 520. First internal interconnects 536, such as bond wires or ribbon bond wires, can connect the second active side 534 and the first side 516 of the tip 514.

A third integrated circuit 540, such as an integrated circuit die, can be mounted over the second integrated circuit 528 with a spacer 542, such as a wire-in-film film including B-stage material, in between. The spacer 542 can surround a portion of the first internal interconnects 536 over the second integrated circuit 528. The third integrated circuit 540 includes a third non-active side 544 and a third active side 546. The third active side 546 includes active circuitry fabricated thereon. Second internal interconnects 537, such as bond wires or ribbon bond wires, can connect the third active side 546 and the first side 516 of the first external interconnects 504.

A top encapsulation 508 can be over the first encapsulation 502 covering the second integrated circuit 528, the first internal interconnects 536, the third integrated circuit 540, the spacer 542, and the second internal interconnects 537. The top encapsulation 508 can expose a periphery portion of the first external interconnects 504. The top encapsulation 508 can form a hermetic seal with the first encapsulation 502.

A second encapsulation 538 such as a cover including a passivation layer, can cover the first active side 524 of the first integrated circuit 520, the planar interconnects 526, and an interior portion of the second side 518 of the base 512 exposing a peripheral portion of the second side 518 of the base 512. The second encapsulation 538 can form a hermetic seal with the first encapsulation 502.

Second external interconnects 510, such as solder balls, can attach to the second side 518 of the base 512 of the first external interconnects 504. The second external interconnects 510 can connect to the next system level (not shown), such as a printed circuit board or another integrated circuit package system.

Figure 6:
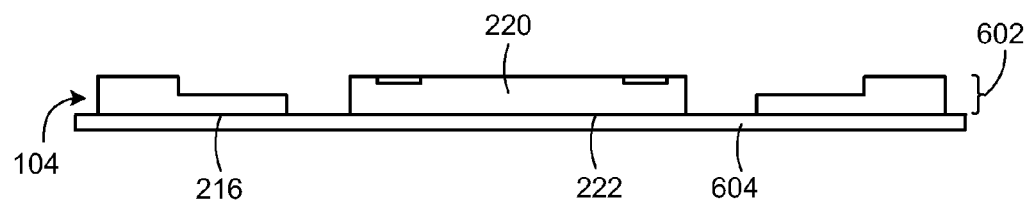
FIG. 6 is a cross-sectional view of a portion of a lead frame.

Referring now to FIG. 6, therein is shown a cross-sectional view of a portion of a lead frame 602. The lead frame 602 includes the first external interconnects 104. The first side 216 of the first external interconnects 104 can be mounted to a mounting structure 604, such as a tape. The first integrated circuit 220 can be mounted over the mounting structure 604 with the first non-active side 222 on the mounting structure 604. The mounting structure 604 provides planar structure such that the first non-active side 222 is planar with the first side 216 of the first external interconnects 104.

Figure 7:
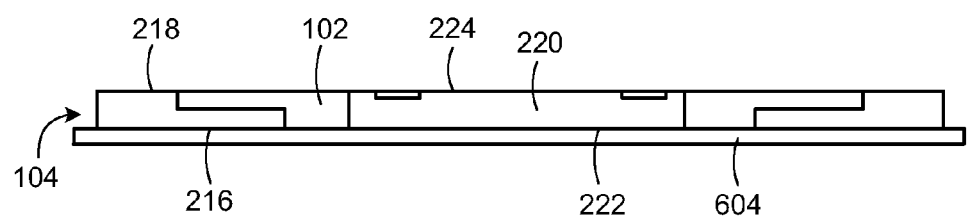
FIG. 7 is the structure of FIG. 6 in forming the first encapsulation.

Referring now to FIG. 7, therein is shown the structure of FIG. 6 in forming the first encapsulation 102. The first encapsulation 102 can be formed surrounding the first external interconnects 104 exposing the second side 218. The first encapsulation 102 attaches to the mounting structure 604 such that the first encapsulation 102 is planar with the first side 216 of the first external interconnects 104 and the first non-active side 222. The first encapsulation 102 can also be planar to the second side 218 of the first external interconnects 104 and the first active side 224 of the first integrated circuit 220.

Figure 8:
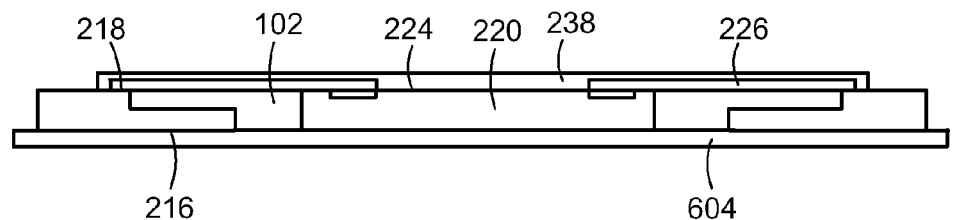
FIG. 8 is the structure of FIG. 7 in forming the planar interconnects and the second encapsulation.

Referring now to FIG. 8, therein is shown the structure of FIG. 7 in forming the planar interconnects 226 and the second encapsulation 238. The planar interconnects 226 can be formed with sputtered copper layer. The planar interconnects 226 connect the first active side 224, exposed from the first encapsulation 102, and the second side 218 of the base 212. The planar interconnects 226 can also be formed over the first encapsulation 102.

The second encapsulation 238 can formed over the first encapsulation 102 covering the first active side 224 of the first integrated circuit 220, the planar interconnects 226, and a portion of the second side 218 of the base 212. The second encapsulation 238 can be laminated epoxy layer, screen/stencil-printed epoxy layer or any other passivation material. The structure with the second encapsulation 238 is over the mounting structure 604.

Figure 9:
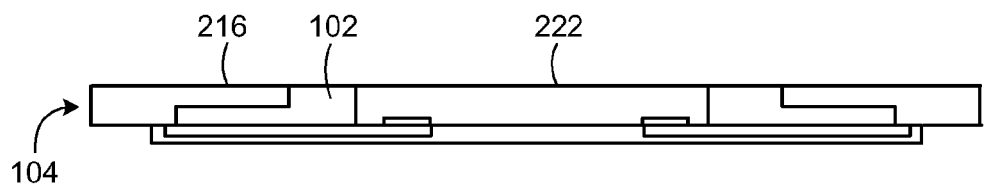
FIG. 9 is the structure of FIG. 8 in exposing the first side of the first external interconnects.

Referring now to FIG. 9, therein is shown the structure of FIG. 8 in exposing the first side 216 of the first external interconnects 104. The mounting structure 604 of FIG. 8 is removed exposing the first side 216, the first encapsulation 102, and the first non-active side 222. The structure without the mounting structure 604 is in a vertically flipped orientation to the structure shown in FIG. 8.

Figure 10:
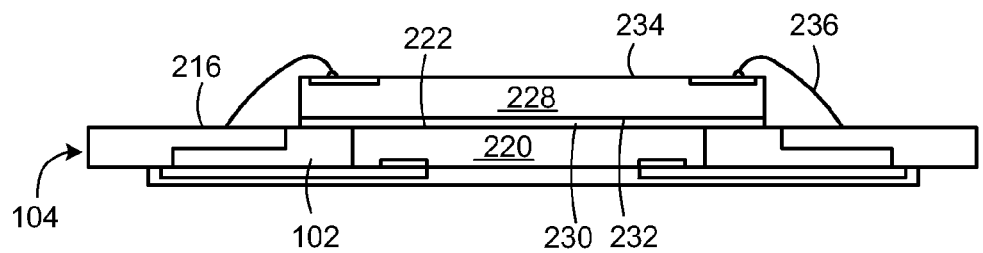
FIG. 10 is the structure of FIG. 9 in attaching the internal interconnects.

Referring now to FIG. 10, therein is shown the structure of FIG. 9 in attaching the internal interconnects 236. The second integrated circuit 228 mounts over the first encapsulation 102 and the first non-active side 222 of the first integrated circuit 220 with the adhesive 230. The second non-active side 232 faces the first non-active side 222. The internal interconnects 236 connect the second active side 234 of the second integrated circuit 228 and the first side 216 of the first external interconnects 104.

Figure 11:
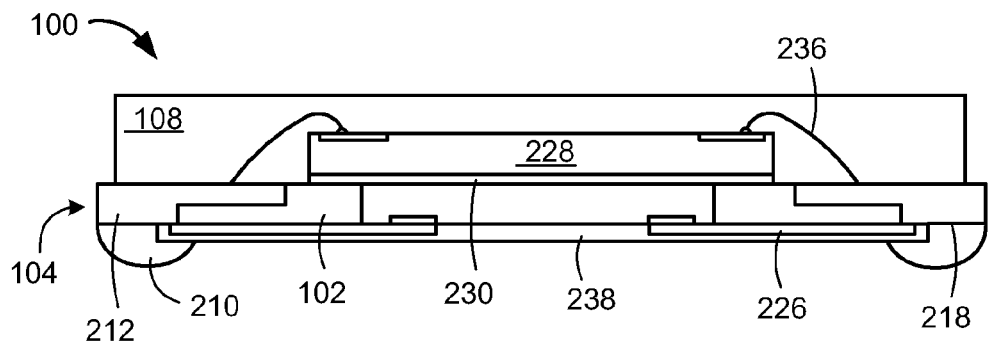
FIG. 11 is the structure of FIG. 10 in forming the top encapsulation and attaching the second external interconnects.

Referring now to FIG. 11, therein is shown the structure of FIG. 10 in forming the top encapsulation 108 and attaching the second external interconnects 210. The top encapsulation 108 can be formed over the first encapsulation 102 and the first external interconnects 104 covering the second integrated circuit 228, the internal interconnects 236, and the adhesive 230. As an example, the top encapsulation 108 does not extend horizontally exposing a peripheral portion of the first external interconnects 104.

The second external interconnects 210 can be formed to the second side 218 of the base 212 of the first external interconnects 104 by a reflow process. The second encapsulation 238 can prevent inadvertent contact of the second external interconnects 210 and the planar interconnects 226. The structure with the second external interconnects 210 can undergo singulation forming the integrated circuit package system 100.

Figure 12:
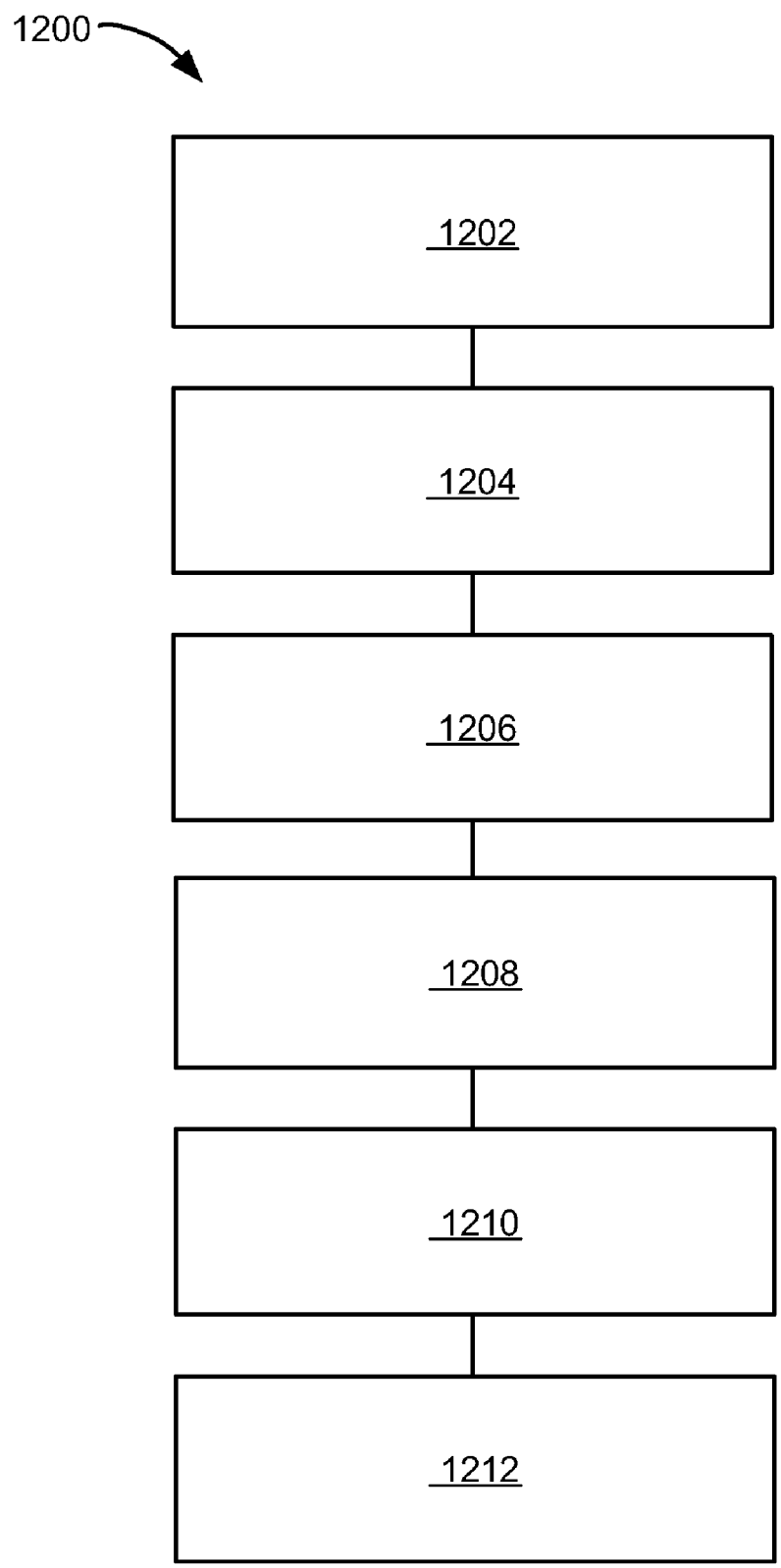
FIG. 12 is a flow chart of an integrated circuit package system for manufacture of the integrated circuit package system in an embodiment of the present invention.

Referring now to FIG. 12, therein is shown a flow chart of an integrated circuit package system 1200 for manufacture of the integrated circuit package system 100 in an embodiment of the present invention. The system 1200 includes forming a first external interconnect having both a first side and a second side that is an opposing side to the first side in a block 1202; forming a first encapsulation around a first integrated circuit and the first external interconnect with the first side, the second side, and the first active side of the first integrated circuit exposed in a block 1204; forming a planar interconnect between the first active side and the second side in a block 1206; forming a second encapsulation covering the planar interconnect and the first active side in a block 1208; connecting a second integrated circuit over the first integrated circuit and the first side in a block 1210; and forming a top encapsulation over the second integrated circuit in a block 1212.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:

forming a first external interconnect having both a first side and a second side that is an opposing side to the first side;

positioning a first integrated circuit having a first active side planar to the second side;

forming a first encapsulation around the first integrated circuit and the first external interconnect with the first side, the second side, and the first active side exposed;

forming a planar interconnect between the first active side and the second side;

forming a second encapsulation covering the planar interconnect and the first active side;

connecting a second integrated circuit over the first integrated circuit and the first side; and forming a top encapsulation over the second integrated circuit.

2. The method as claimed in claim 1 wherein:
forming the first external interconnect includes:
  forming a base and a tip with the base planar to the tip at the first side and the base non-planar to the tip at the second side; and
forming the planar interconnect between the first active side and the second side includes:
  connecting the second side of the base and the first active side.

3. The method as claimed in claim 1 further comprising:
mounting a third integrated circuit over the second integrated circuit; and
wherein forming the top encapsulation includes:
  forming the top encapsulation over the third integrated circuit.

4. The method as claimed in claim 1 wherein forming the first encapsulation includes covering a portion of the second side of the first external interconnect with the first encapsulation.

5. The method as claimed in claim 1 further comprising forming a second external interconnect under the first external interconnect.

6. A method for manufacturing an integrated circuit package system comprising:
forming a first external interconnect having both a base and a tip with the base planar to the tip at a first side of the first external interconnect and the base non-planar to the tip at a second side that is an opposing side to the first side;
positioning a first integrated circuit having a first active side planar to the second side;
forming a first encapsulation around the first integrated circuit and the first external interconnect with the first side, the second side of the base, and the first active side exposed;
forming a planar interconnect between the first active side and the second side of the base;
forming a second encapsulation covering the planar interconnect and the first active side;
connecting a second integrated circuit over the first integrated circuit and the first side; and
forming a top encapsulation over the second integrated circuit.

7. The method as claimed in claim 6 wherein connecting the second integrated circuit over the first integrated circuit and the first side includes mounting a second active side of the second integrated circuit facing the first encapsulation.

8. The method as claimed in claim 6 wherein forming the first encapsulation includes covering the second side of the tip.

9. The method as claimed in claim 6 further comprising mounting the second integrated circuit overhanging the first integrated circuit.

10. The method as claimed in claim 6 wherein forming the planar interconnect includes forming the planar interconnect on the first encapsulation.

11. An integrated circuit package system comprising:
a first external interconnect having both a first side and a second side that is an opposing side to the first side;
a first integrated circuit having a first active side planar to the second side;
a first encapsulation around the first integrated circuit and the first external interconnect with the first side, the second side, and the first active side exposed;
a planar interconnect between the first active side and the second side;
a second encapsulation covering the planar interconnect and the first active side;
a second integrated circuit over the first integrated circuit connected with the first side; and
a top encapsulation over the second integrated circuit.

12. The system as claimed in claim 11 wherein:
the first external interconnect includes a base and a tip with the base planar to the tip at the first side and the base non-planar to the tip at the second side; and
the planar interconnect between the first active side and the second side includes the second side of the base connected with the first active side.

13. The system as claimed in claim 11 further comprising:
a third integrated circuit over the second integrated circuit; and
wherein the top encapsulation is over the third integrated circuit.

14. The system as claimed in claim 11 wherein the first encapsulation is over a portion of the second side of the first external interconnect.

15. The system as claimed in claim 11 further comprising a second external interconnect attached under the first external interconnect.

16. The system as claimed in claim 11 wherein:
the first external interconnect includes a base and a tip with the base planar to the tip at the first side and the base non-planar to the tip at the second side;
the first encapsulation exposes the second side of the base; and
the planar interconnect is between the second side of the base and the first active side.

17. The system as claimed in claim 16 wherein the second integrated circuit includes a second active side facing the first encapsulation.

18. The system as claimed in claim 16 the first encapsulation covers the second side of the tip.

19. The system as claimed in claim 16 wherein the second integrated circuit overhangs the first integrated circuit.

20. The system as claimed in claim 16 wherein the planar interconnect is on the first encapsulation.

* * * * *